United States Patent
Kashiwagi et al.

(10) Patent No.: US 6,858,921 B2
(45) Date of Patent: Feb. 22, 2005

(54) FLEXIBLE PRINTED CIRCUIT SUBSTRATE

(75) Inventors: Shuji Kashiwagi, Kouga-gun (JP); Takahiko Nagakubo, Kouga-gun (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/744,098

(22) Filed: Dec. 24, 2003

(65) Prior Publication Data

US 2004/0173884 A1 Sep. 9, 2004

(30) Foreign Application Priority Data

Dec. 26, 2002 (JP) .................................. 2002-377782

(51) Int. Cl.[7] .............................................. H01L 23/495
(52) U.S. Cl. ................................... 257/668; 257/775
(58) Field of Search ............................. 257/668, 773, 257/775–776

(56) References Cited

U.S. PATENT DOCUMENTS 4,972,580 A * 11/1990 Nakamura .................. 29/840

6,319,019 B1 * 11/2001 Kwon et al. ................. 439/67

FOREIGN PATENT DOCUMENTS

JP          2662477          6/1997

* cited by examiner

*Primary Examiner*—Phat X. Cao
*Assistant Examiner*—Theresa T. Doan
(74) *Attorney, Agent, or Firm*—McDermott Will & Emery LLP

(57) ABSTRACT

A novel flexible printed circuit substrate can be processed into a flexible printed circuit board having a high-accuracy connecting part which does not cause a connection failure when it is connected to a connector even if a pitch between two adjacent terminals is further reduced. The flexible printed circuit substrate has dummy patterns which are formed, simultaneously with the terminals, on the sides of the connecting part, in a shape corresponding to the outline of both sides of connecting part which are used for positioning the terminals when the connecting part is attached to the connector. The dummy patterns are used as masks when a base film is subjected to a laser process.

3 Claims, 5 Drawing Sheets

FLEXIBLE PRINTED CIRCUIT SUBSTRATE

BACKGROUND OF THE INVENTION

1. Field of the Invention

The present invention relates to a flexible printed circuit substrate having a connecting part which is to be attached to a connector.

2. Description of the Background Art

Recently, electronic devices have become lighter and more compact, and flexible printed circuit boards have come into widespread use as materials for electrical circuits in the electronic devices.

A typical flexible printed circuit board has a connecting part which is to be attached to a connector and which is integrally provided on, for example, an edge of the flexible printed circuit board so as to further save space.

FIG. 4(a) is an enlarged perspective view of a connecting part C of a flexible printed circuit board 9a.

As shown in the figure, the flexible printed circuit board 9a includes a substrate 910 composed of a flexible resin film or the like. The substrate 910 is formed in a predetermined planar shape including the connecting part C which is to be attached to a connector, and a plurality of terminals 93 which are electrically connected to electrical circuits (denoted by reference numeral 92 in FIGS. 4(b) and 5) on the substrate 910 are provided on the surface of the connecting part C. The terminals 93 are arranged in parallel with the direction of the connecting part C being inserted into and extracted from the connector as shown by the blank arrow in the figure.

In FIGS. 4(a) and 4(b), reference numeral 940 denotes a cover-lay for protecting the electrical circuits 92 on the substrate 910 and reference numeral 950 denotes a reinforcing board which reinforces the connecting part C so that the connecting part C can be easily inserted into and extracted from the connector.

The flexible printed circuit board 9a is generally obtained by cutting it out of a flexible printed circuit substrate 9 shown in FIG. 5 by a blanking process or the like, and the flexible printed circuit substrate 9 is manufactured by the processes described below.

With reference to FIG. 5, first, the electrical circuits 92, the terminals 93, and plated leads 93a extending from the ends of the terminals 93, all of which are composed of a metallic thin film of copper or the like, are formed, in predetermined planar shapes by a common lithographic method such as an additive method and a subtractive method, on the surface of a base film 91, which is composed of a resin film or the like and which is to be processed into the substrate 910.

Next, the surface of each terminal 93 is plated with gold, solder, or the like using the plated leads 93a as an electrode.

Next, a protecting film 94, which has an opening 94a for exposing the terminals 93 of the connecting part C and which is to be processed into the cover-lay 940, is laminated on the surface of the base film 91 so as to protect the electrical circuits 92, etc. Although not shown in the figure, the protecting film 94 may also have an opening, as needed, for exposing a mounting space for mounting an element at a predetermined position on the electrical circuits 92.

A thick reinforcing film 95, which is to be processed into the reinforcing a board 950, is laminated on the opposite surface, that is, the back surface of the base film 91. Thus, the flexible printed circuit substrate 9, which is to be processed into the flexible printed circuit board 9a, is manufactured.

The thus manufactured flexible printed circuit substrate 9 shown in FIG. 5 is cut by blanking along the peripheral edge F shown by the dot-dashed line which defines the planar shape of the flexible printed circuit board 9a in the figure. In addition, an element is mounted in the above-described mounting space if necessary. Accordingly, the flexible printed circuit board 9a shown in FIG. 4(a) is manufactured.

Such blanking may be at once or part-by-part along its peripheral edge F, using a blanking mold, for example.

In the above-described blanking process, the blanking mold is normally positioned by inserting guide pins provided on the blanking mold through positioning holes formed in the base film 91 at predetermined positions outside the region shown in the figure so that the position of the blanking mold may be adjusted with respect to the terminals 93, etc., provided on the base film 91.

However, since the positioning accuracy achievable in the blanking process is limited, a connection failure may be caused such that the terminals 93 cannot be precisely connected to their respective contacts in the connector when the connecting part C of the flexible printed circuit board is attached to the connector.

The connector and the connecting part C are normally positioned with respect to each other by bringing the sides F1 and F1 of the connecting part C, which are formed in parallel with the insertion/extraction direction shown by the blank arrow in FIG. 4(a), into contact with guides provided on the connector so that the terminals 93 are precisely connected to their respective contacts.

Therefore, the positioning accuracy between the connector and the connecting part C depends on the dimensional accuracy of the pitch (p1 in FIG. 4(b)) between one of the two sides F1 and the centerline of the terminal 93 that is nearest to this side F1, for example. That is, the positioning accuracy between the connector and the connecting part C depends on the absolute value of ±α in the formula:

$$p1'=p1\pm\alpha \tag{1},$$

where p1' is the actual pitch, p1 is the desired pitch, and ±α is the error between them,
and the dimensional accuracy ±α of the pitch p1 depends on the positioning accuracy in the above-described blanking process.

However, the positioning accuracy achievable by the positioning holes and the guide pins is relatively low, and the deviation is more than about ±100 μm (±0.1 mm).

Accordingly, there is the possibility of a connection failure when the connecting part C is attached to the connector in the case where the pitch (p2 in FIG. 4(b)) between two adjacent terminals 93 of the connecting part C is reduced to, for example, about 0.5 mm for obtaining lighter and more compact electronic devices as described above.

In order to surely prevent the connection failure of the flexible printed circuit board in which the pitch p2 between two adjacent terminals 93 is about 0.5 mm, methods for improving the positioning accuracy in the blanking process of the flexible printed circuit substrate are studied.

For example, Japanese Patent No. 2662477 discloses a construction in which a target mark composed of a metallic thin film is formed along with terminals 93, etc. at a position near the connecting part C on a flexible printed circuit substrate 9, and blanking (trimming) for cutting the sides F1 of the connecting part C is performed while positioning a trimming punch (multipunch) by detecting the center of the target mark with a specific measuring camera.

According to this method, a positioning accuracy of ±100 μm or less can be obtained in the blanking process and the connection failure can be surely prevented in the case of the flexible printed circuit board 9a in which the pitch p2 between two adjacent terminals 93 is set to about 0.5 mm to achieve microconnection.

However, further reduction in the pitch of the electrical circuits 92 on the flexible printed circuit board 9a is required for making the electronic devices more lighter and compact, and accordingly, the pitch p2 between the terminals 93 of the connecting part C is also required to be reduced still further.

More specifically, although the pitch p2 between adjacent terminals 93 for microconnection was conventionally 0.5 mm, connecting parts having a pitch p2 of about 0.3 mm have become common, and those with a pitch p2 of about 0.2 mm have been developed recently.

However, the accuracy obtained by the positioning method according to Japanese Patent No. 2662477 is limited to about ±70 μm, and further improvement in the positioning accuracy is difficult in the method.

Therefore, the positioning accuracy cannot be improved enough to comply with further reduction in the pitch, and the connection failure which occurs when the connecting part C of the flexible printed circuit board 9a is attached to the connector has become a problem again.

SUMMARY OF THE INVENTION

An object of the present invention is to provide a novel flexible printed circuit substrate for obtaining a flexible printed circuit board having a high-accuracy connecting part which will not cause a connection failure even if the pitch is further reduced.

According to the present invention, a flexible printed circuit substrate having a connecting part, which is to be attached to a connector and which has a plurality of terminals composed of a metallic thin film, is characterized in that dummy patterns composed of a metallic thin film and used as masks in a laser process for processing at least a base film of the flexible printed circuit substrate are provided at the side of the connecting part.

In the above-described structure, of the peripheral edge which defines the planar shape of the connecting part of the flexible printed circuit board, both sides thereof, which are used for positioning the terminals when the connecting part is attached to the connector, are formed using the dummy patterns composed of a metallic thin film as masks in the at least in the laser process for processing the base film of the flexible printed circuit substrate, more specifically, for processing:

a. the base film;

b. a laminate of the base film and a protecting film which is to be processed into a cover-lay;

c. a laminate of the base film and a reinforcing film which is to be processed into a reinforcing board; or d. a laminate of the base film, the protecting film, and the reinforcing film.

More specifically, in the above-listed films, regions which are not covered by the dummy patterns are irradiated with a laser so that they are selectively removed by etching so as to form both sides of the connecting part, which are used for positioning the terminals when the connecting part is attached to a connector.

If the terminals and the dummy patterns are formed by a lithographic process, the positional accuracy of the dummy patterns with respect to the terminals can be improved to the order of micrometers (about several micrometers or less).

The accuracy of the laser process using the dummy patterns can also be improved to the order of micrometers even if the expansion and contraction of the substrate, or wrap-around of the laser ray is taken into account.

Accordingly, by using the above-described two processes (i.e., lithographic process and laser process) and omitting the blanking process with which sufficient dimensional accuracy cannot be obtained, the dimensional accuracy can be considerably improved. More specifically, the accuracy of ±30 μm or less can be obtained.

Thus, the flexible printed circuit substrate of the present invention enables the manufacture of a flexible printed circuit board having a high-accuracy connecting part which does not cause a connection failure even when the pitch is further reduced.

According to one aspect of the present invention, the terminals and the dummy patterns in a flexible printed circuit substrate are preferably formed simultaneously by a lithographic method.

With such method, the positional accuracy of the dummy patterns with respect to the terminals can be improved to the order of micrometers.

When the flexible printed circuit substrate having such a construction is used, a flexible printed circuit board having a connecting part with a higher accuracy can be manufactured.

According to another aspect of the present invention, the flexible printed circuit substrate is laminated, on the back surface of the base film, with a reinforcing film with a thickness of 300 μm or less which is to be processed into a reinforcing board for reinforcing the connecting part.

With such a structure, since the reinforcing film to be processed into the reinforcing board is composed of a resin film with a thickness of 300 μm or less which can be easily etched by a laser process, the time required for processing the reinforcing film simultaneously with the base film, etc., in the laser process can be reduced.

Accordingly, when the flexible printed circuit substrate having such a construction is used, the productivity of the flexible printed circuit board can be improved.

BRIEF DESCRIPTION OF THE DRAWINGS

FIG. 2(a) is an enlarged plan view showing a region around one of dummy patterns used as masks in a laser process for processing a base film in the flexible printed circuit substrate shown in FIG. 1 and FIG. 2(b) is an enlarged plan view showing the region around the same dummy pattern in the flexible printed circuit board cut out of the flexible printed circuit substrate shown in FIG. 1 by a laser process or the like.

FIG. 3 is a perspective view showing a region around the connecting part of the flexible printed circuit board cut out of the flexible printed circuit substrate shown in FIG. 1 by a laser process or the like.

DETAILED DESCRIPTION OF THE INVENTION

An embodiment of the present invention will be described below with reference to the accompanying drawings.

Figure 1:
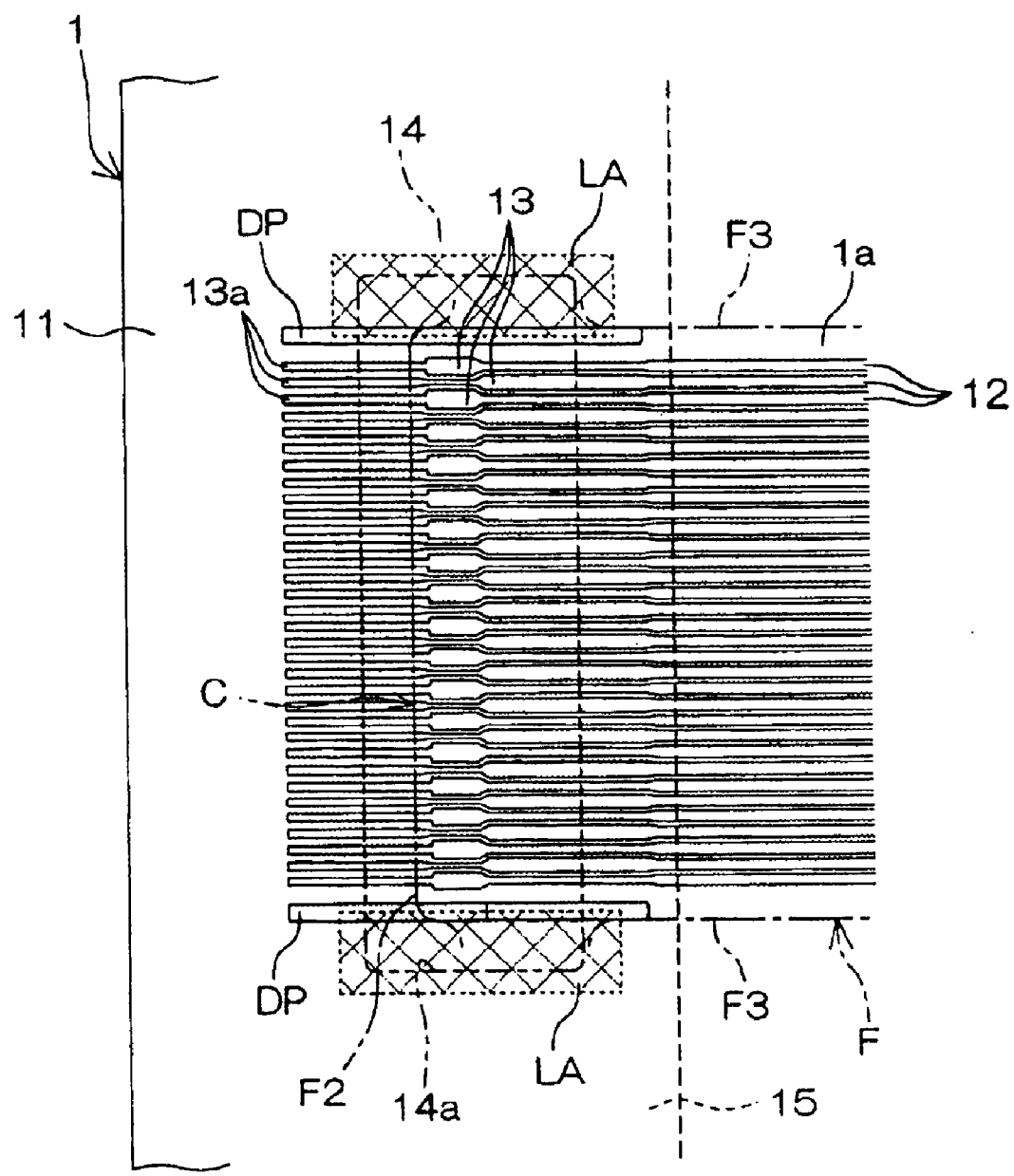
FIG. 1 is an enlarged plan view showing a region around a connecting part of a flexible printed circuit board in a flexible printed circuit substrate according to an embodiment of the present invention.
Figure 2:
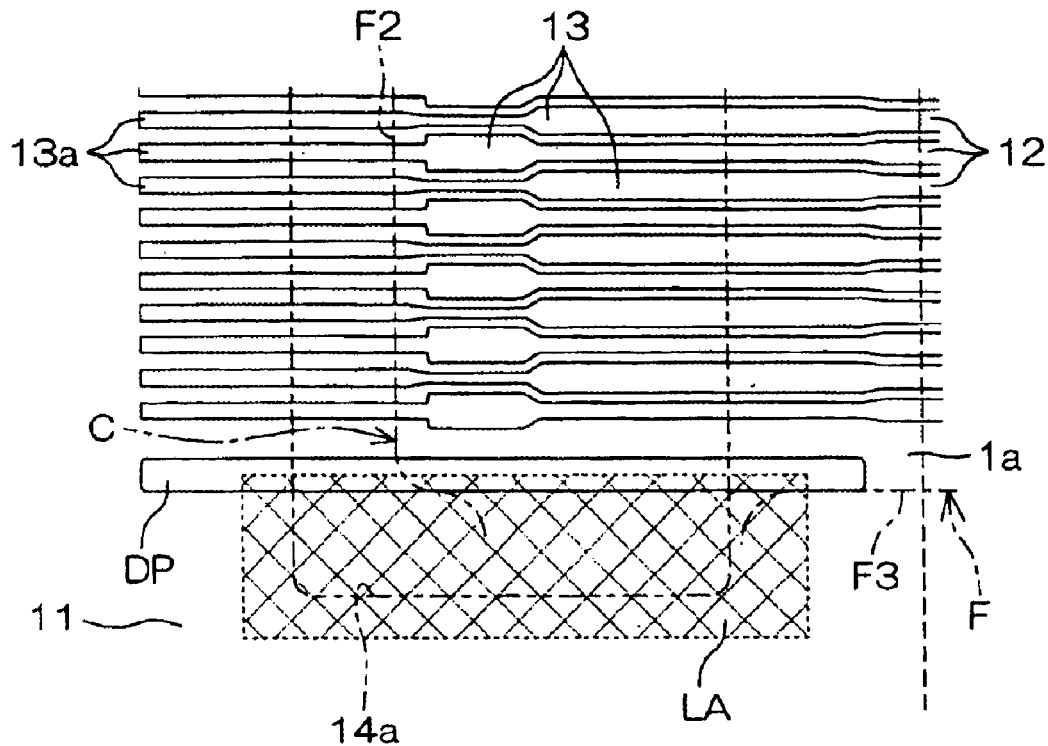
Figure 2:
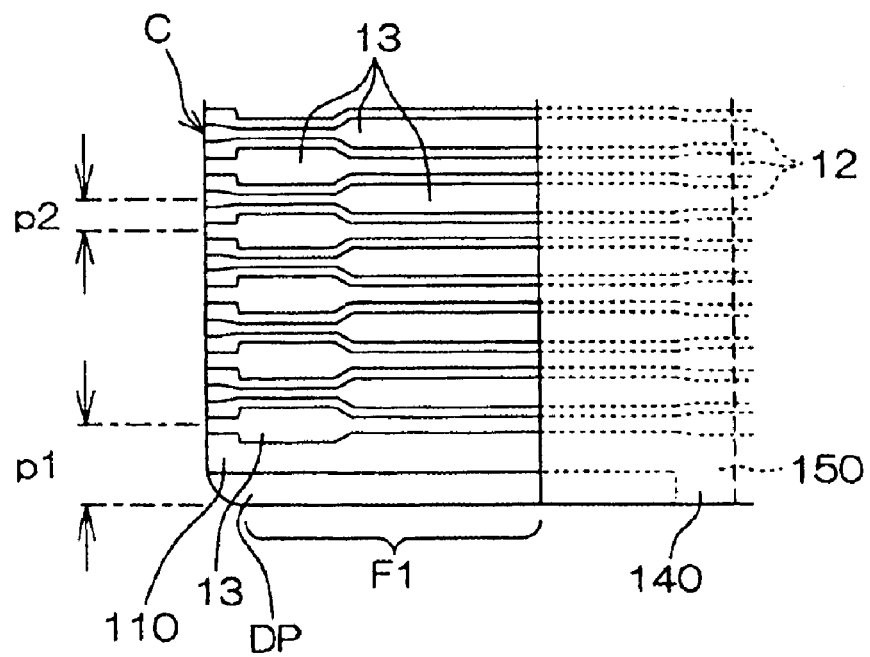

FIG. 1 is an enlarged plan view showing a region around a connecting part C of a flexible printed circuit board 1a in a flexible printed circuit substrate 1 according to an embodiment of the present invention. In addition, FIG. 2(a) is an enlarged plan view showing a region around one of dummy patterns DP used as masks in a laser process for processing a base film 11 in the flexible printed circuit substrate 1.

As shown in the figures, the flexible printed circuit substrate 1 is constructed by forming a region corresponding to the flexible printed circuit board 1a including the connecting part C on the surface of the base film 11 composed of a flexible resin film or the like.

Although only one region corresponding to a single flexible printed circuit board is shown in the figures, two or more regions identical to the above region are normally provided on the surface of a single base film 11 with a standard size (typically 250 mm wide and 450–550 mm long) for increasing the productivity of the flexible printed circuit board. Accordingly, although not shown in the figure, two or more regions which each corresponds to a single flexible printed circuit board are preferably formed on a single base film 11 in the present invention.

The following components composed of a metallic thin film of copper or the like are formed on the base film 11 in the above-described region:

Electrical circuits 12 which serve as internal circuits of the flexible printed circuit board;

Terminals 13 which are electrically connected to the electrical circuits 12 and are arranged in the connecting part C of the flexible printed circuit board; and Two dummy patterns DP used as masks in a laser process for processing the base film 11.

In addition, plated leads 13a extends from the ends of the terminals 13 to the outside of the region.

Figure 3:
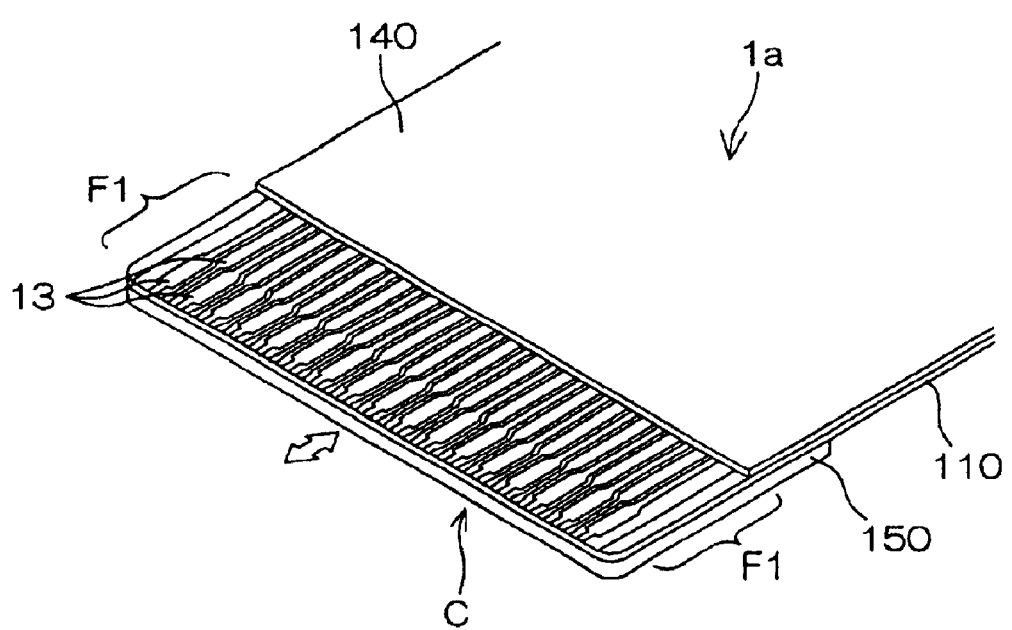
Figure 4:
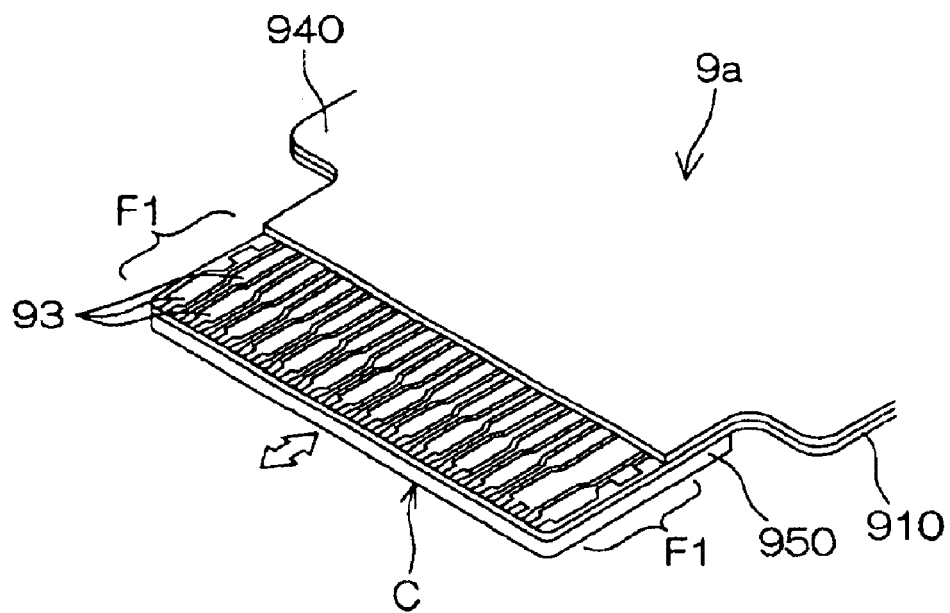
FIG. 4(a) is a perspective view showing a region around a connecting part of a flexible printed circuit board cut out of a known flexible printed circuit substrate by a blanking process and FIG. 4(b) is an enlarged plan view showing a region around one of the sides of the connecting part in the flexible printed circuit board.
Figure 4:
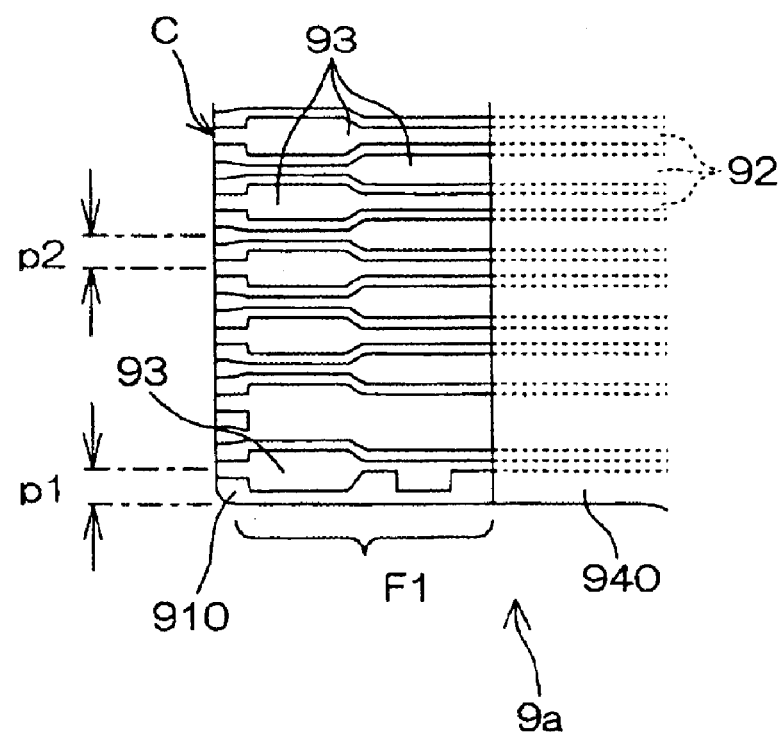
Figure 5:
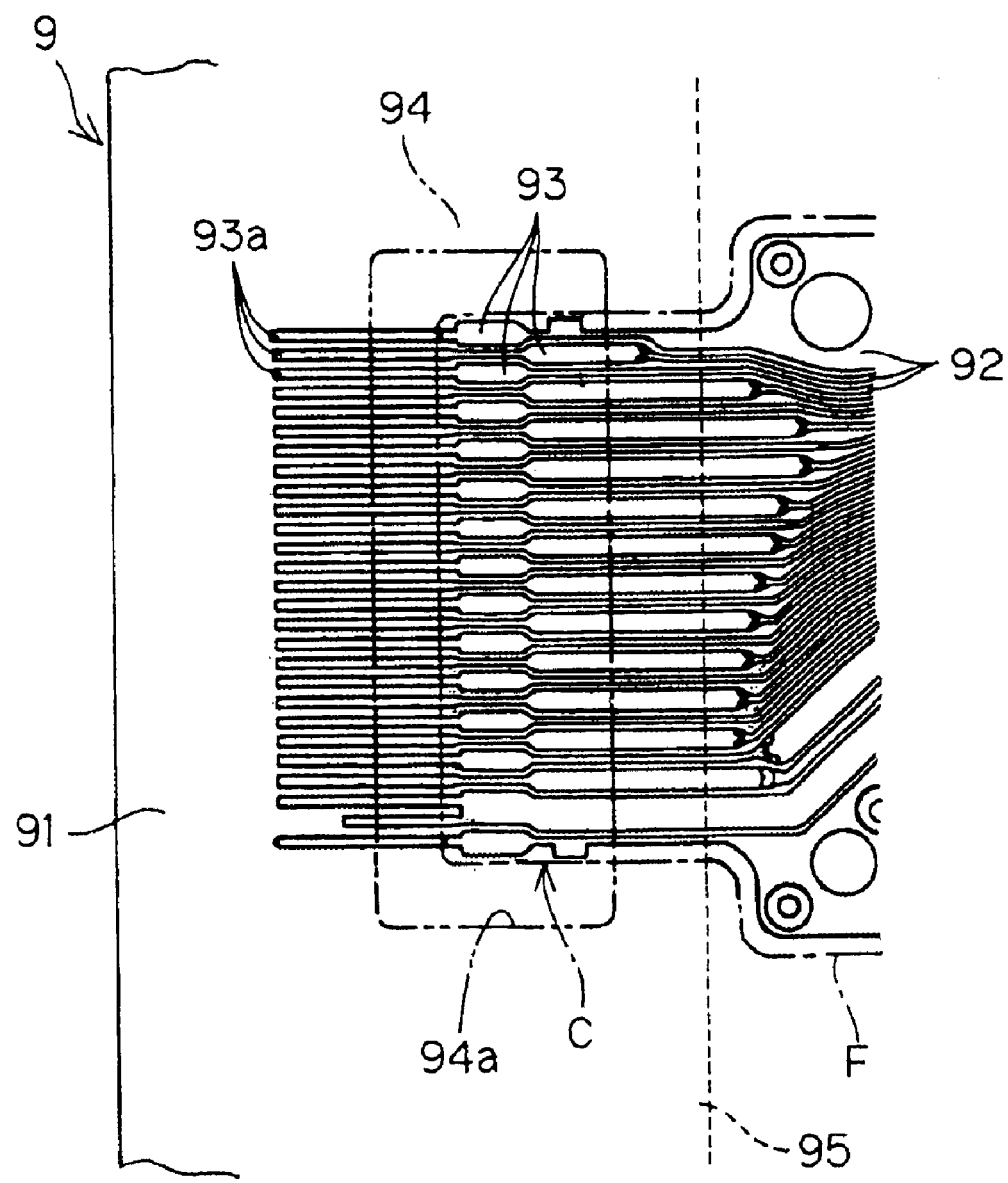
FIG. 5 is an enlarged plan view showing a region around the connecting part of the flexible printed circuit board in the known flexible printed circuit substrate shown in FIG. 4(a).

The two dummy patterns DP are formed in a shape corresponding to the outlines of both sides (denoted by F1 and F1 in FIGS. 2(b) and 3) of the connecting part C with respect to the peripheral edge F which defines the planar shape of the flexible printed circuit board 1a. The sides F1 and F1 of the connecting part C are used for positioning the terminals 13 when the connecting part C is attached to the connector.

The above-mentioned components are preferably formed simultaneously by a lithographic method such as an additive method and a subtractive method. In such a case, the positional accuracy of the two dummy patterns DP with respect to the terminals 13 can be improved to the order of micrometers as described above.

The surface of each terminal 13 is preferably plated with gold, solder, or the like by using the plated leads 13a as in the known construction.

A protecting film 14 having an opening 14a for exposing the terminals 13 of the connecting part C is preferably laminated on the surface of the base film 11 so as to protect the electrical circuits 12, etc. In addition, although not shown in the figures, the protecting film 14 may also have an opening for exposing a mounting space for mounting an element at a predetermined position on the electrical circuits 12.

In addition, a thick reinforcing film 15, which is to be processed into a reinforcing board, is preferably laminated on the opposite surface, that is, the back surface of the base film 11.

In the flexible printed circuit substrate 1 having the above-mentioned components, the base film 11 is composed of a flexible resin film as described, above. In particular, a polyimide film is preferably used because of its dimensional stability, thermostability, durability, flexibility, etc. For the same reason, the protecting film 14 is also composed of a polyimide film.

As described above, the reinforcing film 15 is preferably composed of a resin film with a thickness of 300 $\mu$m or less, and in particular, it is preferably made of polyimide for the same reason as described above.

An adhesive is used for laminating the protecting film 14 on the top surface of the base film 11 and the reinforcing film 15 on the back surface of the base film 11, respectively. The adhesive is preferably of a curable resin group so that the above-described characteristics of each film can be maintained. In particular, an adhesive of an epoxy resin group is preferably used.

When the electrical circuits 12, etc., are formed by a subtractive method, an adhesive is also used for laminating a metallic foil, from which the electrical circuits 12, etc., are formed, on the surface of the base film 11. This adhesive is also preferably of a curable resin group, and in particular, an adhesive of an epoxy resin group is preferably used.

Although the thicknesses of the above-mentioned films are not particularly limited, typical thicknesses of the films are as follows:

Protecting film 14: 12–50 $\mu$m

Cover-lay adhesive layer: 10–40 $\mu$m

Metallic thin film from which electrical circuits 12, etc., are formed: 9–50 $\mu$m Solder plating layer on terminals 13: 2–10 $\mu$m Base adhesive layer: 0–25 $\mu$m Base film 11: 12–50 $\mu$m Reinforcing-board adhesive layer: 30–50 $\mu$m Reinforcing film 15: 25–125 $\mu$m When the flexible printed circuit substrate 1 having the above components is processed to obtain the flexible printed circuit board, laser irradiation areas LA shown as mesh-patterned areas enclosed by short-dashed lines in FIGS. 1 and 2(a) are irradiated with a laser so that both sides F1 and F1 of the connecting part C shown in FIG. 2(b), which are used for positioning the terminals 13 when the connecting part C is attached to the connector, are formed.

More specifically, the laser irradiation areas LA are irradiated with a carbon dioxide laser, a yttrium-aluminum-garnet (YAG) laser, an excimer laser, or the like whose intensity is adjusted such that the metal forming the dummy patterns DP is not etched at all, or is etched at an extremely slow speed and resins such as polyimide are etched at a high speed. Accordingly, the protecting film 14, the base film 11, the reinforcing film 15, and the adhesive layers between these films are partially removed by etching at regions which are not covered with the dummy patterns DP in the laser irradiation areas LA.

When the carbon dioxide laser is used, for example, the laser reaches the back surface of the substrate after five to ten shots of radiation at an energy of 4–10 J such that the above-mentioned films and layers are removed by etching.

When the carbon dioxide laser or the like is used, the edge surfaces of each layer and the surfaces of the dummy patterns DP are hardly damaged by the etching process. In particular, the condition of the edge surfaces of each layer is as good as that obtained using a Thomson blade. Accordingly, the sides F1 and F1 of the connecting part C formed by the laser process can be used for securely positioning the terminals 13 when the connecting part C is attached to the connector.

Then, portions other than the sides F1 and F1 of the peripheral edge F defining the planar shape of the flexible printed circuit board 1a, that is, the side F2 (which intersects the sides F1 and F1) at the end of the connecting part C and the sides F3 and F3 (which extend continuously from the sides F1 and F1) of the main portion of the flexible printed circuit board, are cut by a blanking process so that the flexible printed circuit board 1a shown in FIGS. 2(b) and 3 is produced. (The sides F2, F3, and F3 are shown by the dot-dashed lines in FIGS. 1 and 2(a).)

The sides F2, F3, and F3 may also be cut by a laser process.

However, since the dimensional accuracy of these sides are not required to be as high as that of the sides F1 and F1, they are preferably cut by a conventional blanking process using a blanking mold in view of the productivity and the manufacturing cost of the flexible printed circuit board.

Thus, it is possible to produce a flexible printed circuit board 1a shown in FIGS. 2(b) and 3 which has an improved dimensional accuracy of ±30 $\mu$m or less as described above with respect to the pitch (p1 in FIG. 2(b)) between a side F1 and the centerline of the terminal 13 which is nearest to the side F1.

Therefore, even when the pitch (p2 in FIG. 2(b)) between adjacent terminals 13 arranged in the connecting part C is reduced to about 0.2 mm, the connection failure in which the terminals 13 cannot be precisely connected to their corresponding contacts of a connector can be prevented without fail when the connecting part C is attached to the connector.

In FIGS. 2(b) and 3, reference numeral 110 denotes a substrate obtained by cutting the base film 11 in a predetermined planar shape by the above-described laser process and the blanking process, reference numeral 140 denotes a cover-lay obtained by cutting the protecting film 14 in a predetermined planar shape by the same processes, and reference numeral 150 denotes a reinforcing board obtained by cutting the reinforcing film 15 in a predetermined planar shape by the same processes.

The construction of the present invention is not limited to the embodiment described above with reference to the accompanying drawings, and various modifications are possible within the scope of the present invention.

What is claimed is:

1. A flexible printed circuit substrate comprising:
   a connecting part which is to be attached to a connector, the connecting part having a plurality of terminals composed of a metallic thin film; and
   dummy patterns provided on both sides of the connecting part, the dummy patterns being composed of a metallic thin film and used as masks in a laser process for processing at least a base film of the flexible printed circuit substrate.

2. A flexible printed circuit substrate according to claim 1, wherein the terminals and the dummy patterns are formed simultaneously by a lithographic method.

3. A flexible printed circuit substrate according to claim 1, wherein a reinforcing film with a thickness of 300 $\mu$m or less is laminated on the back surface of the base film, the reinforcing film being to be processed into a reinforcing board for reinforcing the connecting part.

* * * * *

UNITED STATES PATENT AND TRADEMARK OFFICE
CERTIFICATE OF CORRECTION

PATENT NO. : 6,858,921 B2
DATED : February 22, 2005
INVENTOR(S) : Shuji Kashiwagi et al.

It is certified that error appears in the above-identified patent and that said Letters Patent is hereby corrected as shown below:

<u>Title page,</u>
Item [73], Assignee, change "Sumitomo Electric Industries, Ltd., Osaka Japan" to -- Sumitomo Electric Printed Circuits Inc., Shiga, Japan --.

Signed and Sealed this

Seventeenth Day of May, 2005

JON W. DUDAS
*Director of the United States Patent and Trademark Office*